(12) United States Patent
Choi et al.

(10) Patent No.: US 10,770,518 B2
(45) Date of Patent: Sep. 8, 2020

(54) OLED-INTEGRATED TOUCH SENSOR AND OLED DISPLAY DEVICE INCLUDING THE SAME

(71) Applicant: DONGWOO FINE-CHEM CO., LTD., Jeollabuk-do (KR)

(72) Inventors: Byung Jin Choi, Gyeonggi-do (KR); Woo Hyun Bae, Gyeonggi-do (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 38 days.

(21) Appl. No.: 15/992,367

(22) Filed: May 30, 2018

(65) Prior Publication Data
US 2018/0350885 A1 Dec. 6, 2018

(30) Foreign Application Priority Data
May 30, 2017 (KR) .................. 10-2017-0066839

(51) Int. Cl.
| | |
|---|---|
| *H01L 27/32* | (2006.01) |
| *G06F 3/041* | (2006.01) |
| *H01L 51/52* | (2006.01) |
| *H01L 51/50* | (2006.01) |
| *G06F 3/044* | (2006.01) |

(52) U.S. Cl.
CPC ............ *H01L 27/323* (2013.01); *G06F 3/044* (2013.01); *G06F 3/0412* (2013.01); *H01L 51/5012* (2013.01); *H01L 51/5206* (2013.01); *H01L 51/5221* (2013.01); *H01L 51/5253* (2013.01)

(58) Field of Classification Search
CPC combination set(s) only.
See application file for complete search history.

(56) References Cited

U.S. PATENT DOCUMENTS

| | | | |
|---|---|---|---|
| 2015/0130736 A1* | 5/2015 | Liu ................. | G06F 3/0412 345/173 |
| 2016/0026302 A1* | 1/2016 | Li .................. | G06F 3/044 345/174 |
| 2016/0291776 A1* | 10/2016 | Li .................. | G06F 3/0416 |
| 2017/0012147 A1* | 1/2017 | Cheong ........... | H01L 31/022466 |
| 2017/0168608 A1* | 6/2017 | Kim ................ | G06F 3/0412 |

FOREIGN PATENT DOCUMENTS

KR 10-2014-0092366 A 7/2014

* cited by examiner

*Primary Examiner* — Van N Chow
(74) *Attorney, Agent, or Firm* — The PL Law Group, PLLC

(57) ABSTRACT

An OLED-integrated touch sensor includes an organic light emitting diode (OLED) device, and a touch electrode on a surface of the OLED device. The touch electrode includes a driving electrode formed on one surface of a base layer and a receiving electrode formed on an opposing surface of the base layer relative to the one surface. The touch electrode is combined with the OLED device such that the driving electrode faces the surface of the OLED device.

16 Claims, 3 Drawing Sheets

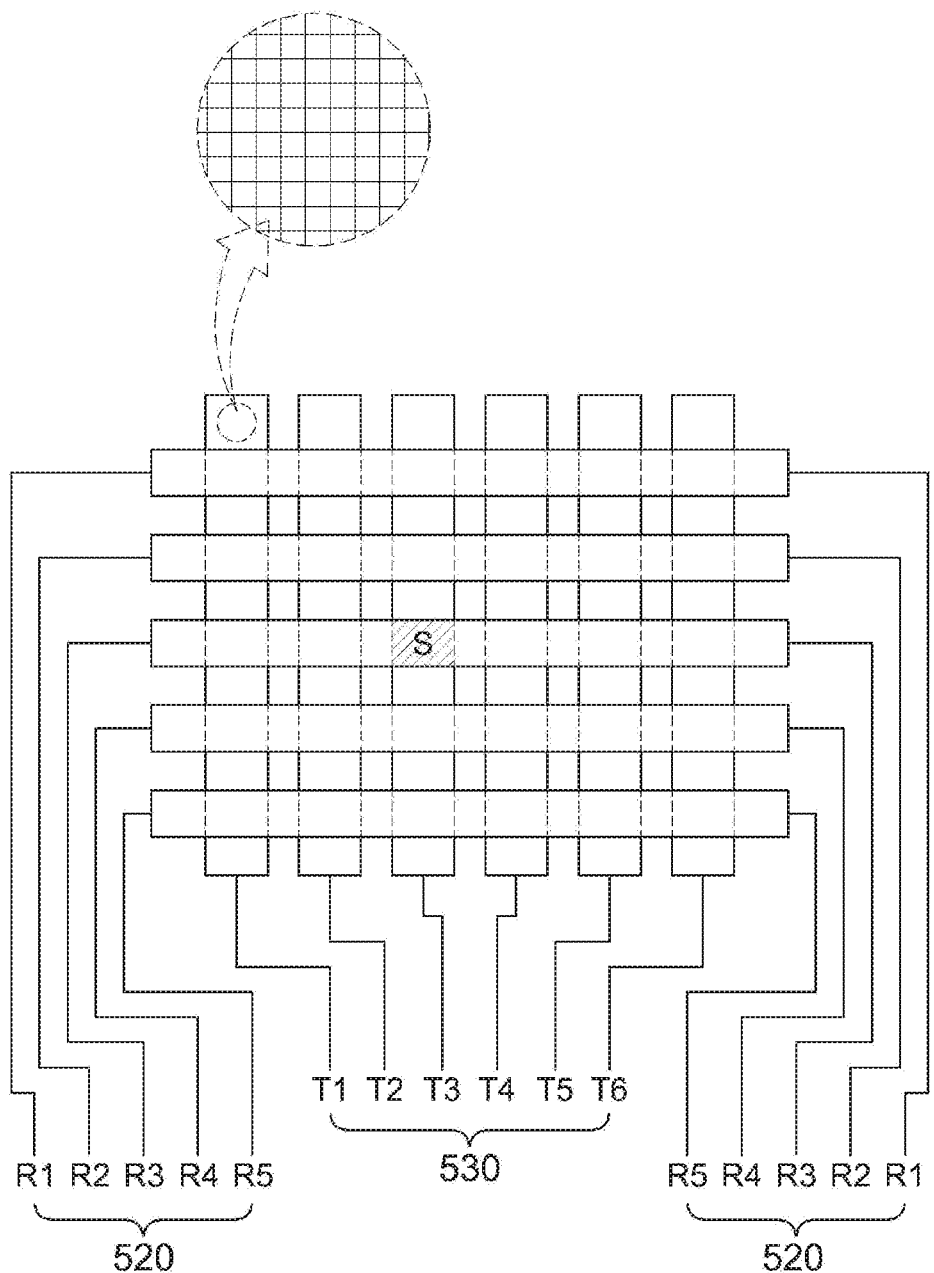

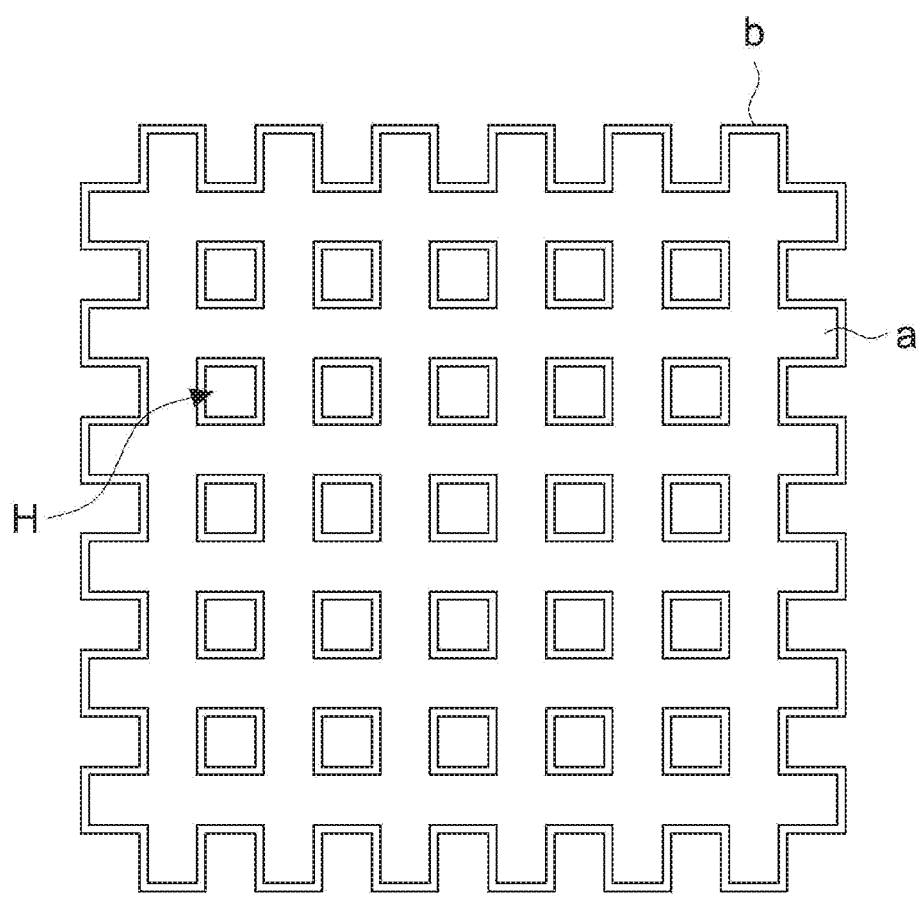

OLED-INTEGRATED TOUCH SENSOR AND OLED DISPLAY DEVICE INCLUDING THE SAME

CROSS-REFERENCE TO RELATED APPLICATION AND CLAIM OF PRIORITY

This application claims priority to Korean Patent Applications No. 10-2017-0066839 filed on May 30, 2017 in the Korean Intellectual Property Office (KIPO), the entire disclosure of which is incorporated by reference herein.

BACKGROUND

1. Field

The present invention relates to an OLED-integrated touch sensor and an OLED display device including the same.

2. Description of the Related Art

As information technologies are being developed, various demands in display devices having thinner dimension, lightweight, high efficiency in power consumption are increasing. The display device may include a flat panel display device such as a liquid crystal display (LCD) device, a plasma display panel (PDP) device, an electro-luminescent display device, an organic light emitting diode (OLED) display device, etc.

The OLED display device are highlighted recently due to a high response speed, a high image quality, a wide viewing angle, a low power consumption, etc.

A touch panel capable of inputting a user's direction by selecting an instruction displayed in a screen is also developed. The touch panel may be equipped on a front face of a display device, and may convert a touched position by a user's hand or an individual tool into an electrical signal.

Accordingly, the instruction selected at the touched position may be accepted as an input signal. An individual input device such as a keyboard or a mouse which is connected to an image display device may be replaced with the touch panel, and thus an application of the touch panel has been expanded.

As described above, a touch screen panel including a touch sensor is employed in various image display devices as disclosed in Korean Patent Publication No. 2014-0092366. However, more economically efficient and simple fabrication process for the touch sensor is needed.

SUMMARY

According to an aspect of the present invention, there is provided an OLED-integrated touch sensor having reduced influence from noise.

According to an aspect of the present invention, there is provided an OLED-integrated touch sensor having reduced reflectivity and improved transmittance.

According to an aspect of the present invention, there is provided an OLED-integrated touch sensor having improved bending and flexible property.

The above aspects of the present inventive concepts will be achieved by the following features or constructions:

(1) An OLED-integrated touch sensor, comprising: an organic light emitting diode (OLED) device; and a touch electrode on a surface of the OLED device, the touch electrode including a driving electrode formed on one surface of a base layer and a receiving electrode formed on an opposing surface of the base layer relative to the one surface, wherein the touch electrode is combined with the OLED device such that the driving electrode faces the surface of the OLED device.

(2) The OLED-integrated touch sensor according to the above (1), wherein the OLED device includes an anode, an organic layer including an organic emitting layer, a cathode and an encapsulation layer which are sequentially formed, wherein the touch electrode is formed on a surface of the encapsulation layer.

(3) The OLED-integrated touch sensor according to the above (2), further comprising a planarization layer on the surface of the encapsulation layer, wherein the touch electrode is formed on the planarization layer.

(4) The OLED-integrated touch sensor according to the above (2), wherein the encapsulation layer includes an organic layer or an organic-inorganic hybrid layer.

(5) The OLED-integrated touch sensor according to the above (1), wherein the OLED device includes a display region and a non-display region, and the touch electrode is formed only on the non-display region of the OLED device.

(6) The OLED-integrated touch sensor according to the above (1), wherein the OLED device includes a display region and a non-display region, and the touch electrode is formed only on the display region of the OLED device.

(7) The OLED-integrated touch sensor according to the above (1), wherein the OLED device includes a display region and a non-display region, and the touch electrode is formed both on the display region and the non-display region of the OLED device.

(8) The OLED-integrated touch sensor according to the above (1), wherein at least one of the driving electrode and the receiving electrode includes a multi-layered mesh structure including a metal layer and a metal oxide layer.

(9) The OLED-integrated touch sensor according to the above (8), wherein the metal layer includes at least one selected from the group consisting of silver, gold, copper, aluminum, platinum, palladium, chromium, titanium, tungsten, niobium, tantalum, vanadium, calcium, iron, manganese, cobalt, nickel, zinc and an alloy thereof.

(10) The OLED-integrated touch sensor according to the above (8), wherein the metal oxide layer includes at least one selected from the group consisting of indium tine oxide (ITO), indium zinc oxide (IZO), aluminum zinc oxide (AZO), gallium zinc oxide (GZO), indium tin zinc oxide (ITZO), zinc tin oxide (ZTO), indium gallium oxide (IGO), tin oxide ($SnO_2$) and zinc oxide (ZnO).

(11) The OLED-integrated touch sensor according to the above (8), wherein a thickness of the metal oxide layer is in a range from 5 nm to about 200 nm.

(12) The OLED-integrated touch sensor according to the above (8), wherein a refractive index of the metal oxide layer at a wavelength of 550 nm is in a range from 1.7 to 2.2.

(13) The OLED-integrated touch sensor according to the above (8), wherein a thickness of the metal layer is in a range from 5 nm to about 250 nm.

(14) The OLED-integrated touch sensor according to the above (8), wherein the touch electrode includes a triple-layered mesh structure that includes a first metal oxide layer, the metal layer and a second metal oxide layer which are sequentially stacked.

(15) The OLED-integrated touch sensor according to the above (8), wherein the touch electrode includes a mesh pattern having a line width from 1 μm to 7 μm.

(16) The OLED-integrated touch sensor according to the above (8), wherein the driving electrode includes a mesh electrode having an aperture ratio in a range from 80% to 98%.

(17) The OLED-integrated touch sensor according to the above (3), wherein the planarization layer includes a refractive index matching layer.

(18) An OLED display device comprising the OLED-integrated touch sensor according to any one of the above (1) to (17).

The OLED-integrated touch sensor according exemplary embodiments may be directly formed on an OLED device, and may block an electromagnetic influence from an electrode in the OLED device so that a noise of a touch signal may be reduced.

Further, the OLED-integrated touch sensor may include a mesh type touch electrode to have an improved bending or flexible property, and may be effectively applied to a flexible display device.

The OLED-integrated touch sensor may include a touch electrode having a double-layered structure of a metal layer and a metal oxide layer so that an image visibility may be enhanced.

BRIEF DESCRIPTION OF THE DRAWINGS

FIG. 2 is a schematic top plane view including a partially enlarged view illustrating an OLED-integrated touch sensor in accordance with exemplary embodiments; and FIG. 3 is a schematic top plane view illustrating a mesh electrode structure of an OLED-integrated touch sensor in accordance with exemplary embodiments.

DETAILED DESCRIPTIONS

Figure 1:
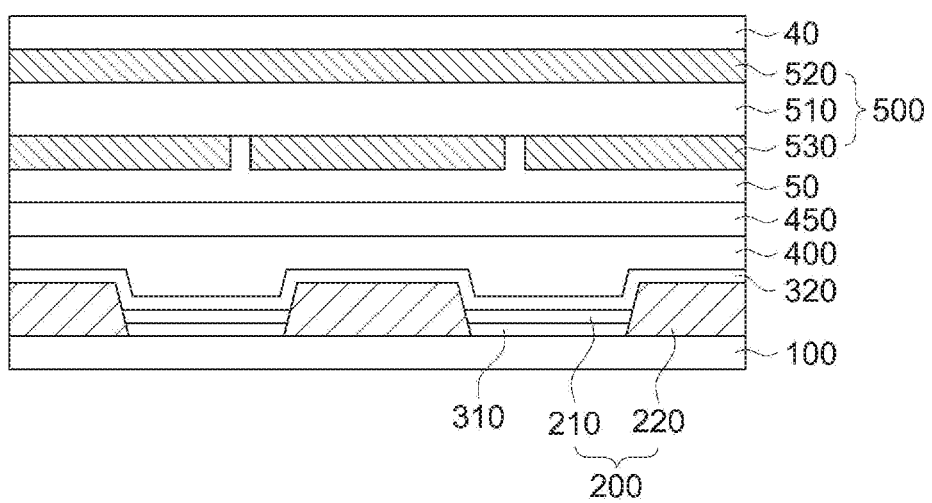
FIG. 1 is a schematic cross-sectional view illustrating an OLED-integrated touch sensor in accordance with exemplary embodiments.

According to example embodiments, an OLED-integrated touch sensor having improved bending, optical and electrical properties, and an image display device including the same are provided. The OLED-integrated touch sensor includes an OLED device, and a touch electrode including a driving electrode formed on one surface of a base layer and a receiving electrode formed on the other surface of the base layer. The touch electrode is disposed on the OLED device such that the driving electrode may face the OLED device. The Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

The terms used herein "upper" and "lower" indicate relative locational relationships with reference to the accompanying drawings, and are not to be construed as limiting absolute locations.

FIG. 1 is a schematic cross-sectional view illustrating an OLED-integrated touch sensor in accordance with exemplary embodiments.

According to exemplary embodiments, the OLED-integrated touch sensor may include an OLED device and a touch electrode 500. The OLED device may include a substrate 100, an anode 310, an organic layer 200, a cathode 320 and an encapsulation layer 400. The touch electrode 500 may include a base layer 510, and a driving electrode 530 and a receiving electrode 520 formed on both surfaces of the base layer 510. A protective layer 40 may be formed on the touch electrode 500.

The substrate 100 may include a material commonly used in an OLED device, for example, glass, a polymer, quartz or a ceramic. The polymer may include cyclo olefin polymer (COP), polyethylene terephthalate (PET), polyacrylate (PAR), polyetherimide (PEI), polyethylene naphthalate (PEN), polyphenylene sulfide (PPS), polyallylate, polyimide (PI), cellulose acetate propionate (CAP), polyethersulfone (PES), cellulose triacetate (TAC), polycarbonate (PC), cyclo olefin copolymer (COC), polymethylmethacrylate (PMMA), or the like. These may be used alone or in a combination thereof. For example, the substrate 100 may include polyimide.

The OLED device may be divided into a display region and a non-display region. An OLED may be disposed in the display region to form a pixel, and pixels neighboring each other may be separated or divided by the non-display region. Referring to FIG. 1, a region between the neighboring non-display regions 220 may be defined as the display region. The anode 310, an organic light emitting layer 210 and the cathode 320 may be sequentially formed in the display region. For example, the non-display region 220 may include a black matrix formed of a cured resin. Thus, the organic light emitting layer 210 and the non-display region 220 are defined as the organic layer 210 herein. However, the non-display region 220 is not limited as only including an organic material.

The encapsulation layer 400 may be formed on the cathode 320. An organic material included in the organic light emitting layer 210 may be oxidized when contacting moisture or oxygen to degrade a life-span of the OLED device. Accordingly, the encapsulation layer 400 may serve as a barrier layer to prevent a permeation of oxygen, and may further serve as an optical or electrical shielding layer.

The encapsulation layer 400 may have a structure commonly used in the related art, and may include, e.g., a glass substrate, an organic layer or an organic-inorganic hybrid layer. The encapsulation layer 400 may include the organic layer or the organic-inorganic hybrid layer for improving a flexible property.

In some embodiments, a planarization layer 450 may be further formed on the encapsulation layer 400 so that touch electrodes may be uniformly formed thereon. The planarization layer 450 may further include a refractive index matching layer (IML) for improving an image quality. For example, the IML layer may include an organic layer or an inorganic layer formed using a material commonly known in the related art.

In exemplary embodiments, the touch electrode may be formed on one surface of the encapsulation layer 400 or the planarization layer 450.

The touch electrode 500 may include the driving electrode 530 formed on one surface of the base layer 510, and the receiving electrode 520 formed on the other surface (e.g., an opposing surface relative to the one surface). The touch electrode 500 may be attached to the OLED device such that the driving electrode 530 may face the OLED device.

When the OLED device is combined to the touch electrode 500, a noise may be generated by an electromagnetic field from electrodes such as the anode 310, the cathode 320, etc., included in the OLED device to interrupt a touch signal and deteriorate a touch sensitivity. The noise may become larger as the OLED device and the touch electrode becomes nearer to each other, and thus an implementation of a thin-layered structure may be limited due to the noise.

However, according to exemplary embodiments, the driving electrode 530 and the receiving electrode 520 of the touch electrode 500 may be arranged at different levels based on the base layer 510, and the touch electrode 500 may be combined to the OLED device such that the driving electrode 530 may be closer the OLED device.

Specifically, the driving electrode 530 may face the OLED device, and the driving electrode 530 may be interposed between the receiving electrode 520 and the OLED device. Thus, the electromagnetic field from the OLED device may be blocked by the driving electrode 530 so that an influence of the electromagnetic field to the receiving electrode 520 may be remarkably reduced. Accordingly, the noise to the touch signal may be also reduced to improve touch accuracy and sensitivity.

The driving electrode 530 and the receiving electrode 520 may have shapes commonly employed in the related art. For example, the driving electrode 530 and the receiving electrode 520 may include quadrangle or rhombus patterns connected to each other or may have a bar shape.

For convenience of descriptions, FIG. 2 illustrates the bar-shaped driving electrode 530 and receiving electrode 520, and an illustration of the base layer 510 is omitted.

Referring to FIG. 2, the driving electrode 530 and the receiving electrode 520 may extend in different directions from each other. A trace wiring may be connected to at least one end portion of the driving electrode 530 and the receiving electrode 520 to be connected to an IC via a pad portion.

In an embodiment, unit electrodes T1 through T6 of the driving electrode 530 and unit electrodes R1 through R5 may be sequentially scanned, and an area at which a capacitance is changed by a touch of a user may be detected so that a touch sensing may be implemented. Specifically, when the unit electrodes T1-T6 and R1-R5 are sequentially scanned, an electrode from which a scanning signal is not generated may be grounded. For example, when a position designated as "S" in FIG. 2 is scanned, the signal may be generated only from the unit electrodes T3 and R3, and other unit electrodes T1, T2. T4, T5, T6, R1, R2, R4 and R5 may be grounded to block an electric field from the OLED device. Thus, the touched position may be detected rapidly with improved accuracy.

However, various touch sensing methods commonly known in the related art may be also applied.

In an embodiment, the driving electrode 530 and the receiving electrode 520 included in the touch electrode 500 may have a mesh structure as illustrated in a partially enlarged view included in a circle of FIG. 2.

The touch electrode may have the mesh structure so that bending, flexible and restoring properties may be improved while obtaining a low sheet resistance. In this aspect, a line-width of a mesh pattern in the mesh structure may be in a range from 1 μm to about 7 μm.

In an embodiment, the driving electrode 530 may be formed as a mesh electrode, an aperture ratio of which may be in a range from about 80% to 98%. Within this range of the aperture ratio, electrical property, transmittance and image visibility may be further improved. If the aperture ratio is less than about 80%, transmittance may be decreased, and an electrode pattern and a moire fringe may be viewed by a user. If the aperture ratio exceeds about 98%, a resistance of the electrode may be increased and a response speed may be decreased.

Additionally, the touch electrode 500) may include a double-layered structure of a metal layer and a metal oxide layer so that a reflectivity to an incident light may be reduced and a transmittance may be increased. The metal layer may have a high reflectivity to cause a reduction of image visibility when solely used. However, according to exemplary embodiments, the metal oxide layer may be used together with the metal layer so that the reflectivity may be reduced while improving the transmittance.

In a conventional mutual-capacitance type touch electrode structure including a driving electrode and a receiving electrode formed on the same surface or plane of a substrate, a bridge electrode formed of a metal may be arranged in an intersection area of unit sensing electrodes. However, an image visibility may be degraded by the metallic bridge electrode, and thus the mutual-capacitance type touch electrodes are commonly arranged in a non-display region of the OLED device (e.g., at an upper portion or a lower portion of the non-display region).

However, according to exemplary embodiments, the touch electrode 500 may include the double-layered structure so that the touch electrodes may be arranged commonly in a display region and the non-display region. Further, even though the touch electrodes 500) are arranged only in the display region, a reduction of the image visibility may be prevented.

FIG. 3 is a schematic top plane view illustrating a mesh electrode structure of an OLED-integrated touch sensor in accordance with exemplary embodiments.

Referring to FIG. 3, the touch electrode may include the double-layered structure including the metal layer (designated as "b") and the metal oxide layer (designated as "a") and having a mesh shape. As illustrated in FIG. 3, the metal oxide layer may be formed on the metal layer to be nearer to a user so that the reduction of the image visibility by the metal layer may be avoided. However, a stacking order of the metal oxide layer and the metal layer may be properly adjusted.

As illustrated in FIG. 3, a line-width of the metal layer may be greater than that of the metal oxide layer. However, the line widths of the metal layer and the metal oxide layers may be substantially the same as each other, or the line-width of the metal oxide layer may be greater than that of the metal layer.

In an embodiment, the touch electrode 500 may include a triple-layered structure in which a first metal oxide layer, a metal layer and a second metal oxide layer are sequentially stacked so that the reflectivity of the touch electrode 500 may be further reduced while also improving the transmittance.

The metal layer may be formed of a metal having improved electrical conductivity and low sheet resistance. Non-limiting examples of the metal may include silver, gold, copper, aluminum, platinum, palladium, chromium, titanium, tungsten, niobium, tantalum, vanadium, calcium, iron, manganese, cobalt, nickel, zinc or an alloy thereof. For example, the metal layer may be formed of silver, gold, copper, palladium, aluminum or an alloy thereof to further improve a bending property. For example, the metal layer may be formed of an alloy of silver, copper and palladium (Ag—Pd—Cu: APC).

According to example embodiments, the metal oxide layer may be formed of a transparent metal oxide, e.g., indium tine oxide (ITO), indium zinc oxide (IZO), aluminum zinc oxide (AZO), gallium zinc oxide (GZO), indium tin zinc oxide (ITZO), zinc tin oxide (ZTO), indium gallium oxide (IGO), tin oxide ($SnO_2$), or zinc oxide (ZnO). These may be used alone or in a combination thereof. For example, at least one of ITO and IZO may be used to further improve image quality and being property. More preferably, IZO may be used.

According to example embodiments, if the touch electrode 500 includes the first metal oxide layer and the second metal oxide layer, the first metal oxide layer and the second metal oxide layer may include the same material or different materials. For example, the first metal oxide layer and the second metal oxide layer may each include at least one of ITO and IZO. More preferably, the first metal oxide layer and the second metal oxide layer may each include IZO.

Thicknesses of the metal layer and the metal oxide layer may not be specifically limited. In some embodiments, the thickness of the metal oxide layer may be in a range from about 5 nm to about 200 nm and the thickness of the metal layer may be in a range from about 5 nm to about 250 nm in consideration of high transmittance, low reflectivity and improved bending property. More preferably, the thickness of the metal oxide layer may be in a range from about 30 nm to about 50 nm and the thickness of the metal layer may be in a range from about 8 nm to about 15 nm.

If the touch electrode 500 has the triple-layered structure including the first metal oxide layer, the metal layer and the second metal oxide layer, the first and second metal oxide layers may have relatively high refractive indexes, and the metal layer may have a relatively low refractive index. Thus, a mesh type electrode pattern having a structure of high refractive index-low refractive index-high refractive index may be obtained so that the touch electrode 500 may have both high transparency and low reflectivity to have remarkably improved optical property. For example, the refractive index of the first metal oxide layer and the second metal oxide layer at a wavelength of 550 nm may each be in a range from about 1.7 to about 2.2. The refractive index of the metal layer at a wavelength of 550 nm may be in a range from about 0.1 to about 1.0, and an extinction coefficient may be in a range from about 2.0 to about 7.0. The extinction coefficient may be measured by Equations 1 and 2.

$$I=I_0 e^{(-\alpha T)} \quad \text{[Equation 1]}$$

In the Equation 1, $\alpha$ represents an absorption coefficient, T represents a thickness, $I_0$ represents a light intensity before transmission, and I represents a light intensity after transmission.

$$\alpha = 4\pi k/\lambda_0 \quad \text{[Equation 2]}$$

In the Equation 2, $\alpha$ represents an absorption coefficient, k represents an extinction coefficient, and $\lambda_0$ represents a wavelength.

The base layer 510 may include a substrate material for forming a touch electrode commonly used in the related art. For example, the material used in the substrate 10 may be also used in the base layer 510.

The touch electrode 500 may be attached on a surface of the encapsulation layer 400 or the planarization layer 450 via. e.g., an adhesive layer or a touch protection layer 50.

The touch electrode 500 may have enhanced flexible property, and may be combined with the OLED device through a simple attaching process or a transfer process using a roll.

In exemplary embodiments, the protective layer 40 may be further formed on the touch electrode 500. The touch electrode 500 may be protected and insulated from an external environment by the protective layer 40.

The protective layer 40 may include a material capable of protecting a touch electrode commonly used in the related art. For example, the protective layer 600 may include an organic layer, an inorganic oxide layer or an organic-inorganic hybrid layer.

The OLED-integrated touch sensor according to exemplary embodiments may be applied to an OLED display device. The OLED-integrated touch sensor may have remarkably improved image visibility, and bending and electrical properties to be effectively applied to a flexible image display device.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An organic light emitting diode (OLED)-integrated touch sensor, comprising:
    an organic light emitting diode (OLED) device; and
    a touch electrode on a surface of the OLED device, the touch electrode including a driving electrode formed on one surface of a base layer and a receiving electrode formed on an opposing surface of the base layer relative to the one surface,
    wherein the touch electrode is combined with the OLED device such that the driving electrode faces the surface of the OLED device;
    the OLED device includes a display region and a non-display region, and the touch electrode is formed on at least one of the display region and the non-display region; and
    the OLED device includes an anode, an organic layer including an organic emitting layer, a cathode, an encapsulation layer and a planarization layer which are sequentially formed, and the planarization layer includes a refractive index matching layer.

2. The OLED-integrated touch sensor of claim 1, wherein the encapsulation layer includes an organic layer or an organic-inorganic hybrid layer.

3. The OLED-integrated touch sensor of claim 1, wherein the touch electrode is formed only on the non-display region of the OLED device, not on the display region.

4. The OLED-integrated touch sensor of claim 1, wherein the touch electrode is formed only on the display region of the OLED device, not on the non-display region.

5. The OLED-integrated touch sensor of claim 1, wherein at least one of the driving electrode and the receiving electrode includes a multi-layered mesh structure including a metal layer and a metal oxide layer.

6. The OLED-integrated touch sensor of claim 5, wherein the metal layer includes at least one selected from the group consisting of silver, gold, copper, aluminum, platinum, palladium, chromium, titanium, tungsten, niobium, tantalum, vanadium, calcium, iron, manganese, cobalt, nickel, zinc and an alloy thereof.

7. The OLED-integrated touch sensor of claim 5, wherein the metal oxide layer includes at least one selected from the group consisting of indium tine oxide (ITO), indium zinc oxide (IZO), aluminum zinc oxide (AZO), gallium zinc oxide (GZO), indium tin zinc oxide (ITZO), zinc tin oxide (ZTO), indium gallium oxide (IGO), tin oxide (SnO2) and zinc oxide (ZnO).

8. The OLED-integrated touch sensor of claim 5, wherein a thickness of the metal oxide layer is in a range from 5 nm to about 200 nm.

9. The OLED-integrated touch sensor of claim 5, wherein a refractive index of the metal oxide layer at a wavelength of 550 nm is in a range from 1.7 to 2.2.

10. The OLED-integrated touch sensor of claim 5, wherein a thickness of the metal layer is in a range from 5 nm to about 250 nm.

11. The OLED-integrated touch sensor of claim 5, wherein the touch electrode includes a triple-layered mesh structure that includes a first metal oxide layer, the metal layer and a second metal oxide layer which are sequentially stacked.

12. The OLED-integrated touch sensor of claim 5, wherein the touch electrode includes a mesh pattern having a line width from 1 μm to 7 μm.

13. The OLED-integrated touch sensor of claim 5, wherein the driving electrode includes a mesh electrode having an aperture ratio in a range from 80% to 98%.

14. An OLED display device comprising the OELD-integrated touch sensor of claim 1.

15. An organic light emitting diode (OLED)-integrated touch sensor, comprising:
    an organic light emitting diode (OLED) device; and
    a touch electrode on a surface of the OLED device, the touch electrode including a driving electrode formed on one surface of a base layer and a receiving electrode formed on an opposing surface of the base layer relative to the one surface,
    wherein the touch electrode is combined with the OLED device such that the driving electrode faces the surface of the OLED device; and
    wherein the OLED device includes a display region and a non-display region, and the touch electrode is formed only on the display region of the OLED device, not on the non-display region.

16. An organic light emitting diode (OLED)-integrated touch sensor, comprising:
    an organic light emitting diode (OLED) device; and
    a touch electrode on a surface of the OLED device, the touch electrode including a driving electrode formed on one surface of a base layer and a receiving electrode formed on an opposing surface of the base layer relative to the one surface,
    wherein the touch electrode is combined with the OLED device such that the driving electrode faces the surface of the OLED device; and
    the OLED device includes a display region and a non-display region, and the touch electrode is formed only on the non-display region of the OLED device, not on the display region.

* * * * *